US006400760B1

(12) United States Patent
Gu et al.

(10) Patent No.: US 6,400,760 B1
(45) Date of Patent: Jun. 4, 2002

(54) APPARATUS AND METHOD FOR AN ERROR SIGNAL COMPRESSION TECHNIQUE IN A FAST ADAPTIVE EQUALIZER CIRCUIT

(75) Inventors: Richard X. Gu; Hiep V. Tran, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/176,485

(22) Filed: Oct. 21, 1998

Related U.S. Application Data

(60) Provisional application No. 60/062,707, filed on Oct. 22, 1997.

(51) Int. Cl.[7] ............................ H03H 7/30; H03H 7/40; H03K 5/159

(52) U.S. Cl. ........................ 375/232; 370/268; 370/456

(58) Field of Search ................................ 375/232, 249, 375/240; 370/268; 708/550; 235/152

(56) References Cited

U.S. PATENT DOCUMENTS 3,891,837 A * 6/1975 Sunstein .................... 235/152

* cited by examiner

*Primary Examiner*—Stephen Chin
*Assistant Examiner*—Heechul Kim
(74) *Attorney, Agent, or Firm*—J. Dennis Moore; W. James Brady, III; Frederick J. Telecky, Jr.

(57) ABSTRACT

In a transceiver unit including an adaptive equalizer filter unit, apparatus is provided for reducing or compressing the number of bits representing an error signal. The apparatus replaces a plurality of the most significant logic signal bits with a single bits while transferring the sign logic signal bit and the logic signal bits of lesser significance unchanged. Because of the reduction in the number of logic signal bits, the number of components implementing the multiplier unit in the adaptive filter unit can be reduced (i.e., in each stage of the adaptive filter). The reduction of the apparatus implementing the processing the error signal results in the same equilibrium value of the error signal, however, the time to reach this equilibrium value is increased.

7 Claims, 3 Drawing Sheets

30
$e_0$
$e_1$
$e_2$
$e_3$
$e_4$
$e_5$
$e_6$
$e_7$
42
41
SWITCH UNIT
43
$e'_0$
$e'_1$
$e'_2$
$e'_3$
$e'_4$

APPARATUS AND METHOD FOR AN ERROR SIGNAL COMPRESSION TECHNIQUE IN A FAST ADAPTIVE EQUALIZER CIRCUIT

This amendment claims priority under 35 USC §119(e) (1) of provisional application No. 60/062,707, filed Oct. 22, 1997.

BACKGROUND OF THE INVENTION

1. Field of the Invention

This invention relates generally to the processing of signals in communication systems and, more particularly, to equalizer circuits. Equalizer circuits or adaptive filter units are used to compensate for distortion introduced into the channel during the transmission of signals. The present invention has particular applicability to modem units.

2. Description of the Prior Art

Referring to FIG. 1, a block diagram of a transceiver unit capable of advantageously using the present invention is shown. INPUT SIGNALS are applied to symbol encoder and side-stream scrambler unit 11. Output signals from the symbol encoder and side-stream scrambler unit 11 are applied to transmitter unit A 15 and to transmitter unit B 13. The output signals from transmitter unit A 15 are applied to hybrid unit 18, while the output signals from transmitter unit B 13 are applied to hybrid unit 17. The output signals from hybrid unit 17 and hybrid unit 18 are applied to cable 19. Signals from cable 19 are transmitted through hybrid unit 17 to receiver unit B 14 and through hybrid unit 18 to receiver unit A 16. The output signals from receiver unit A 16 and from receiver unit B 14 are applied symbol decoder and side-stream descrambler unit 12. The output signals from the symbol decoder and side-stream descrambler unit 12 are the OUTPUT SIGNALS from the transceiver.

In the transmitter unit A 15, the input signals are applied to a digital transmit filter unit 151. The output signals from the digital transmit filter unit 151 are processed by an digital-to-analog converter unit 152 and applied to an analog transmit filter unit 153. The output signal of the analog transmit unit 153 is the output signal of the transmitter A 15 which is applied to a hybrid unit 18. The transmitter B 13 is implemented in a similar manner.

With respect to the receiver A 16, the output signals from the hybrid unit 18 are applied to a VGA unit 169. The output signals from the VGA unit 169 are processed by an analog receive filter unit 168 and applied to an analog-to-digital converter unit 167. Output signals from the analog-to-digital converter unit 167 are applied to a digital linear forward equalizer unit 166 and to a gain, timing, control unit 170. The signals from the digital linear forward equalizer unit 166 are applied to a summation network 165 and to the gain, timing and control unit 170. The gain, timing and control unit 170 applies control signals to the VGA unit 169 and to the analog-to-digital converter unit 167. The summation unit 165 also receives signals from an echocanceller unit 161, from a NEXT canceller unit 162 and from a feedback filter/noise predictor unit 164. Output signals from the summation unit 165 are applied to a decision unit 163. The decision unit 163 provides the output signal for receiver A 16. The output signal from the decision unit 163 is also applied to the feedback filter/noise prediction unit 164. The decision unit 163 applies an error signal to the echo canceller unit 161, to NEXT canceller unit 162, to feedback filter/noise reduction unit 164, and digital linear forward equalizer unit 166. The echo canceller unit also receives signals which are applied to the transmitter A 15 associated with the receiver A 16, while the NEXT canceller unit 162 receives an input signal from the transmitter B 13 not associated with the receiver unit A 16 which includes the NEXT canceller unit 162. The receiver B 13 is implemented in a manner similar to receiver A 16.

Referring to FIG. 2, a block diagram of an adaptive equalizer filter unit 20, such as would be used to implement the echo canceller unit 161 and the NEXT canceller unit 162 of FIG. 1, is shown. The equalizer unit 20 includes a multiplicity N of stages. Each stage n of the equalizer unit 13 includes a delay line $D_n$, (the delay line $D_0$ is shown with dotted lines because the presence of this delay line is not needed to the operation of filter 20. The delay lines $D_0$–$D_{N-1}$ of all of the stages are coupled in series. The output terminal of each delay line $D_n$ is coupled, in addition to being coupled to the next sequential delay line $D_{n+1}$, to a multiplier unit $M_n$ associated with the $n^{th}$ stage and to an input terminal of update unit $U_n$ associated with the $n^{th}$ stage. Each multiplier unit $M_n$ also receives a coefficient signal $C_n$. The coefficient signal $C_n$ is a signal group stored in the update unit $U_n$ which is updated $U_n$ in response to an ERROR signal e and the output signal of delay line $D_n$. An ERROR signal e is generated as a result of each signal group processed in the decision unit shown in FIG. 1. The product of the signals $C_n$ and the output signal from delay line $D_n$ formed in multiplier unit $M_n$ is applied to one terminal of adder unit $A_m$. The adder unit $A_m$ also receives an output signal from one of the neighboring filter stages. The adder units $A_0$–$A_{M-1}$ are the first stage of an adder tree, the remaining adder units would be included in element 29. The output signals of the adder tree, including the adder units $A_0$–$A_{M-1}$ and the element 29, are the DATA OUT signals (X').

The signals applied to the multiplier unit $M_n$ are the following:

$X_n$ is the output signal from delay line $D_n$, and $C_{n,t+1}$ is given by the formula $C_{n,t+1}=C_{n,t}+\mu e_t X_{n,t-1}$ The error signal is implemented with a plurality of digital bits. In the implementation of the transceiver of the present invention, 8 bits, including a sign bit, are used to represent the error signal. This error signal is generated in the two's complement format to expedite selected processing procedures. None-the-less, because the error signal, as described in the foregoing equations, is used in a multiplication procedure, a large portion of the components of the transceiver can be devoted to the multiplication.

A need has therefore been felt for apparatus and an associated method to reduce the number of components required to implement a transceiver unit, and more particularly, to reduce the number of components in (while increasing the throughput of) the transceiver unit dedicated to processing the error signal in the adaptive filter unit.

SUMMARY OF THE INVENTION

The aforementioned and other features are accomplished, according to the present invention, by providing apparatus for reducing a plurality of the most significant bits to a single bit in an adaptive filter error signal, the error signal being implemented in a two's complement format. This single bit composite most significant bit, the sign bit, and the remaining bits of lesser significance are applied to the adaptive filter. Because the number of bits representing the error signal has been compressed (i.e., reduced), both the amount of apparatus required to process the error signal in the adaptive filter unit, as well as the time required in the processing of the error signal is reduced. The time for the convergence of the error signal to a steady state value is increased as a result of the compressed representation of the error signal.

These and other features of the present invention will be understood upon the reading of the following description in conjunction with the Figures.

DESCRIPTION OF THE PREFERRED EMBODIMENT(S)

1. Detailed Description of the Drawings

Figure 1:
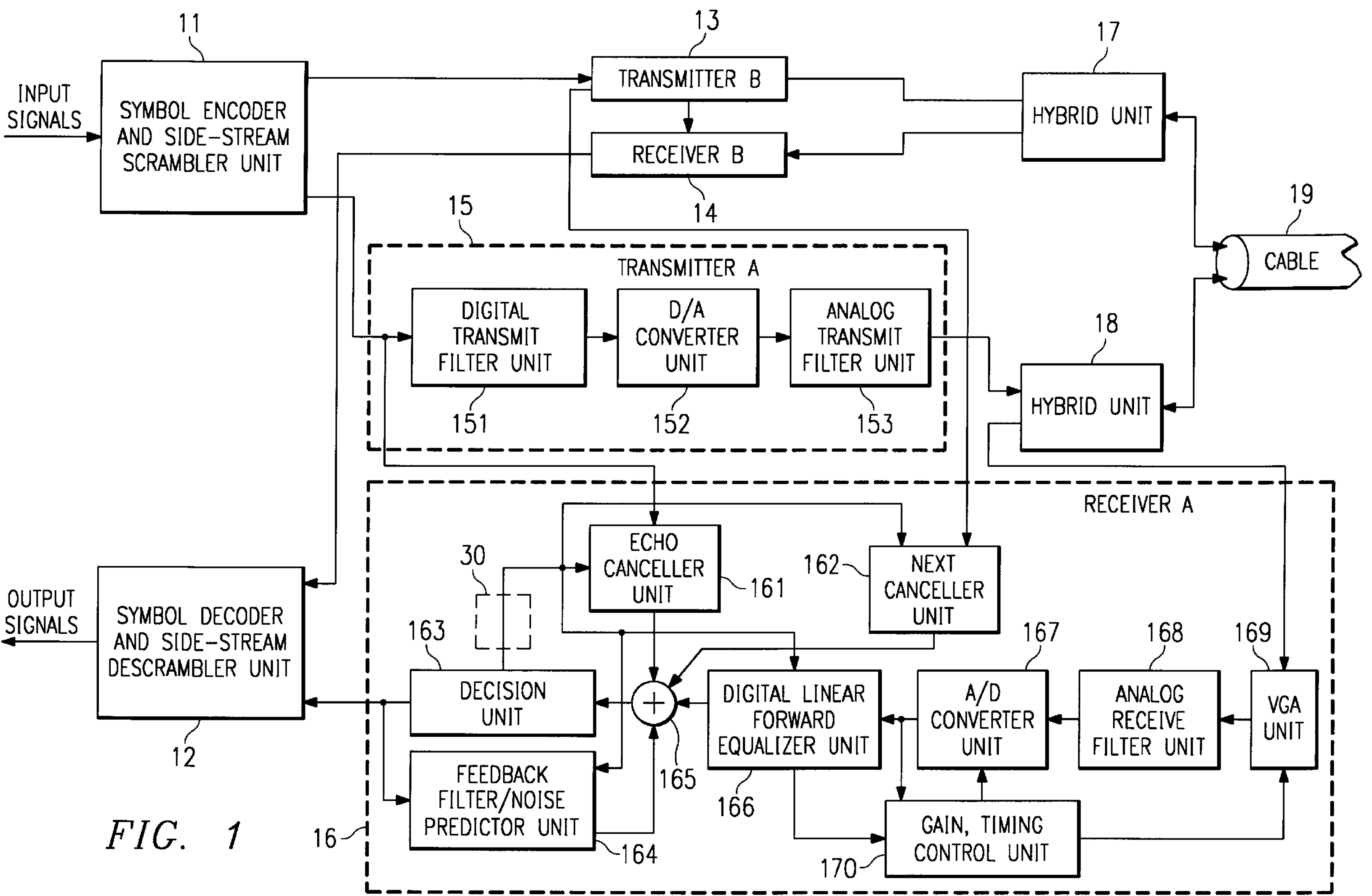
FIG. 1 is a block diagram of a transceiver unit in which the reduced error bit technique in a fast adaptive equalizer circuit of the present invention can be advantageously implemented.
Figure 2:
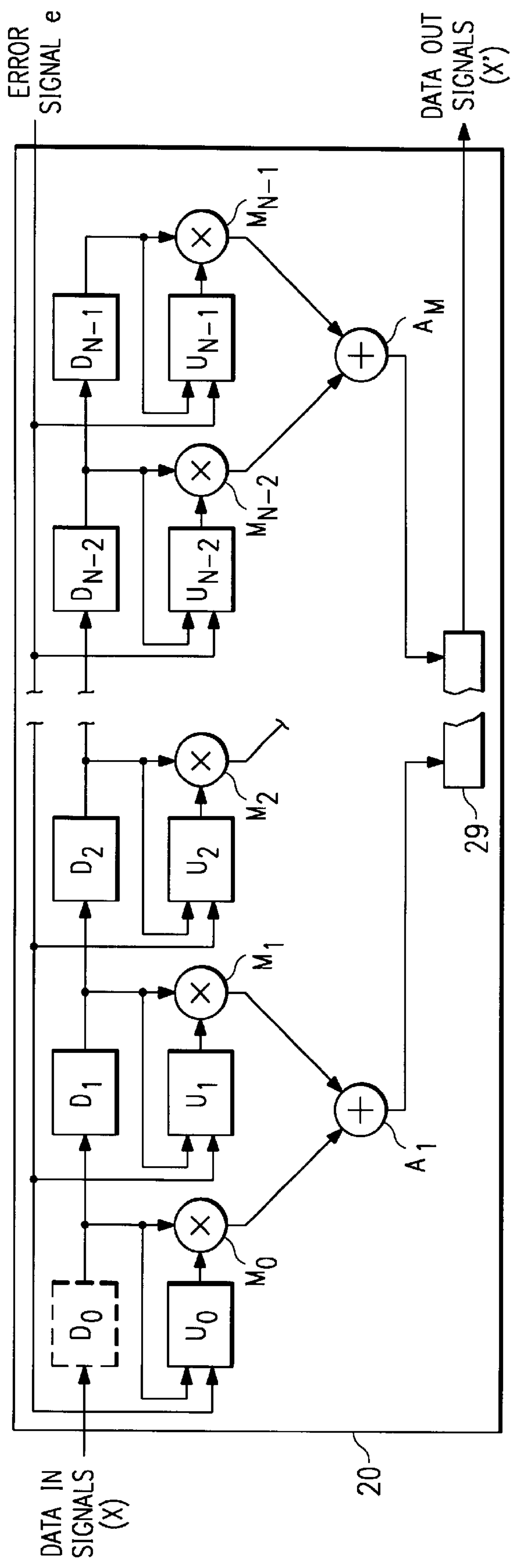
FIG. 2 is a block diagram of an adaptive equalizer filter according to the present invention.
Figure 3:
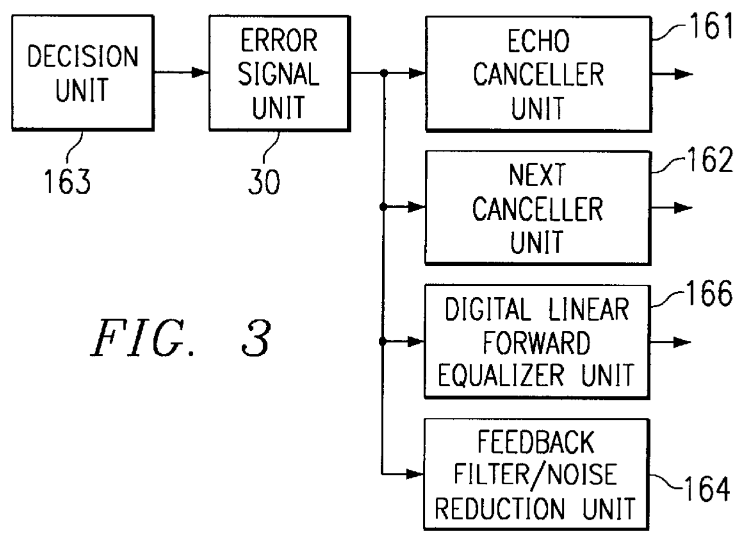
FIG. 3 is a block diagram illustrating the position of the error signal compression unit in the transceiver according to the present invention.

Referring to FIG. 3, the position of the error signal compression unit 30, according to the present invention. The error signal, which is applied to echo canceller unit 161, NEXT canceller unit 162, the feedback filter/noise reduction unit 164 and the digital linear forward equalizer unit 166, is generated in the decision unit 163 in (FIG. 1) after processing the input signals. The error signal is then applied to error signal reduction unit 30 where the number of bits representing the error signal is reduced. The output signal from the error signal reduction unit 30 is applied to adaptive equalizer filter unit (i.e., echo canceller unit 161 in FIG. 1), the NEXT canceller unit 162, the feedback filter/noise reduction unit 164, and the digital linear forward equalizer unit 166. (The position of the error signal compression unit 30 is shown by dotted lines in FIG. 1.)

Figure 4:
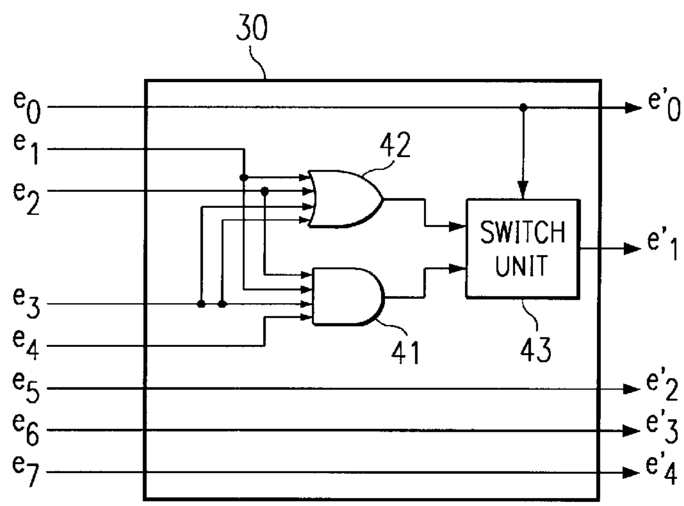
FIG. 4 is a schematic block diagram of the error signal compression unit for use with a two's complement representation of an error signal according to the present invention.

Referring to FIG. 4, a block diagram of the error signal reduction unit 30 is shown. An error signal having bits $e_0$–$e_7$ is used to illustrate the apparatus. The input error signal sign bit, $e_0$, is transmitted by unit 30 and becomes the output error signal sign bit $e'_0$. The input error signal bits $e_1$–$e_4$ are applied to input terminals of logic AND gate 41 and applied to the input terminals of logic OR gate 42. The output terminal of logic AND gate 41 is applied to a first input terminal of switch 43, while an output terminal of logic OR gate 43 is applied to a second input terminal of switch 43. An output terminal of switch 43 is the output error signal $e'_1$. A control terminal of switch 43 coupled to the error signal sign bit $e_0$. The input error signals $e_5$–$e_7$ are transmitted by the error signal reduction unit 30 as the output errors signals $e'_2$–$e'_4$.

Figure 5:
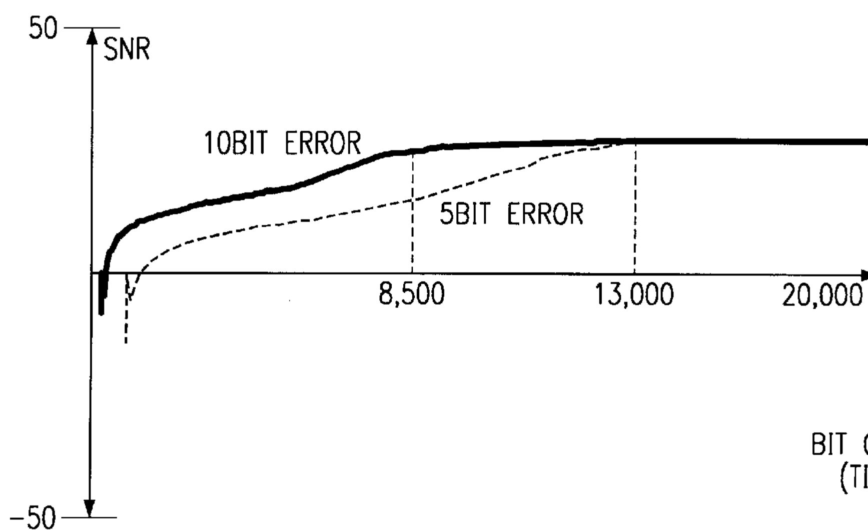
FIG. 5 is a chart illustrating the comparison of the convergence of a full error signal and a compressed error signal in an adaptive filter arrangement of the transceiver according to the present invention.

Referring to FIG. 5, a comparison of the convergence of a 10 logic bit error signal with a 5 logic bit error signal is shown. This comparison was generated by computer simulation techniques. The ordinate shows the signal-to-noise ratio for the two error bit signals. The abscissa is a measure of the time (actually the bit count) during which the digital data signal is being processed by the adaptive filter.

2. Operation of the Preferred Embodiment(s)

In the present invention, the number of bits representing an error signal, in two's complement format, is reduced (i.e., from 8 bits to 5 bits in the example shown in FIG. 4). The reduction is accomplished by representing a plurality of the most significant, non-sign, error signal bits with a single composite error signal bit. That is, the composite error signal bit indicates whether the most significant, non-sign error signal bits represent the presence or the absence of an error having a magnitude in the range represented by the most significant, non-sign error signal bits. Because the error signal is represented in a two's complement format, the presence of error signal bit indicating the presence of an error in the range of magnitudes represented by most significant, non-sign error signal bits. Therefore, the sign bit is used to select the output signal from the logic AND gate or from the logic OR gate to be applied to the composite output error signal bit.

In essence, the magnitude of the output error signal is reduced by this procedure. Therefore, a longer convergence to reach the steady state error signal level is required. Because the error signals of a lesser degree of significance have not been changed, the same steady state error signal will ultimately be reached. These results are verified by FIG. 5.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. For example, the compression of an 8-bit error signal into a 5-bit error signal has been herein described. As will be clear, the invention is suitable for any error signal 4 bits or greater. It is accordingly intended that the claims shall cover all modifications and applications as do not depart from the spirit and scope of the invention.

What is claimed is:

1. In a system including adaptive filter unit and a decision unit for generating an error signal to be applied to said adaptive filter, apparatus for reducing the number of logic signal bits representing said error signal when said error signal is in a two's complement format, said apparatus comprising:

- a selection unit responsive to a sign logic signal bit of said error signal for transmitting a logic signal when said error signal has an absolute value greater than a preselected degree of significance; and
- transmitting conductors for transmitting said sign logic signal bit and transmitting logic signal bits having degrees of significance equal to or less than said preselected degree of significance.

2. The apparatus of claim 1 wherein said selection unit includes:

- a logic OR circuit having all non-sign error bit signals with a degree of significance greater than said preselected degree of significance applied to input terminals thereof;
- a logic AND gate having said all non-sign error bit signals having a degree of significance greater than said preselected degree of significance applied to input terminals thereof; and a switch having output signals from said logic OR gate and said logic AND gate applied to input terminals thereof, said switch responsive to said sign bit signal for transmitting an output signal of said logic OR gate when said sign bit signal is a logic zero and for transmitting an output signal of said logic AND gate when said sign bit signal is a logic one.

3. A method of reducing number of bit signals representing an error signal, said method comprising the steps of:

when a sign bit signal is a logic zero, applying a logic one output signal when any of the non-sign error signal logic bits with a degree of significance greater than an a preselected value is a logic one;

when a sign bit signal is a logic zero, applying a logic one output signal when all of said non-sign error signal logic bits is a logic one.

4. In a transceiver unit, apparatus for reducing the number of bits in a two's complement error signal generated by a decision unit and applied to an adaptive filter unit, said apparatus comprising:

conducting paths for transmitting a sign bit and selected bits of lesser significance from input terminals to output terminals; and a compression unit responsive to said sign bit for generating a compressed error bit signal from error bit signals of greater significance than said selected bits of lesser significance, said composite signal being applied to an output terminal of said apparatus.

5. The apparatus of claim 4 wherein said composite unit includes a logic AND gate, a logic OR gate and switch.

6. The apparatus of claim 5 wherein said error signal bits or greater significance are applied to input terminals of said logic AND gate and input terminals of said logic OR gate.

7. The apparatus of claim 6 wherein said switch transmits an output signal from said logic OR gate when said sign bit is a logic zero.

* * * * *